US012685099B2

(12) United States Patent
See et al.

(10) Patent No.: US 12,685,099 B2
(45) Date of Patent: Jul. 14, 2026

(54) METHOD OF MULTI-LAYER DIE STACKING WITH DIE-TO-WAFER BONDING

(71) Applicant: Applied Materials, Inc., Santa Clara, CA (US)

(72) Inventors: Guan Huei See, Singapore (SG); Jinho An, San Jose, CA (US); Arvind Sundarrajan, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 516 days.

(21) Appl. No.: 18/105,801

(22) Filed: Feb. 3, 2023

(65) Prior Publication Data

US 2024/0266319 A1     Aug. 8, 2024

(51) Int. Cl.
| | |
|---|---|
| *H10W 20/00* | (2026.01) |
| *H10W 72/00* | (2026.01) |
| *H10W 74/01* | (2026.01) |
| *H10W 80/00* | (2026.01) |

(52) U.S. Cl.
CPC ....... *H10W 20/023* (2026.01); *H10W 74/014* (2026.01); *H10W 72/0198* (2026.01); *H10W 80/312* (2026.01); *H10W 80/327* (2026.01)

(58) Field of Classification Search
None
See application file for complete search history.

(56) References Cited

U.S. PATENT DOCUMENTS

| | | | |
|---|---|---|---|
| 10,847,443 B2 | 11/2020 | Lin | |
| 11,205,625 B2 | 12/2021 | DeLaCruz et al. | |

| | | | | |
|---|---|---|---|---|
| 11,276,676 | B2 | 3/2022 | Enquist et al. | |
| 2011/0042820 | A1 | 2/2011 | Knickerbocker | |
| 2017/0186730 | A1 | 6/2017 | Shen et al. | |
| 2018/0162725 | A1* | 6/2018 | Shen ........................ H04R 7/16 |
| 2020/0294966 | A1 | 9/2020 | Chen et al. | |
| 2021/0143071 | A1 | 5/2021 | Lan et al. | |
| 2021/0166953 | A1* | 6/2021 | Hsiung ................. H01L 23/367 |
| 2021/0175143 | A1 | 6/2021 | Yu et al. | |

(Continued)

FOREIGN PATENT DOCUMENTS

| | | |
|---|---|---|
| CN | 1122340538 | 10/2022 |

OTHER PUBLICATIONS

International Search Report for PCT/US2023/082200, datsd Apr. 12, 2024.

*Primary Examiner* — Jay C Chang

(74) *Attorney, Agent, or Firm* — Moser Taboada

(57) ABSTRACT

Embodiments of methods of die stacking are provided herein. In some embodiments, a method of die stacking with die-to-wafer bonding includes: bonding a plurality of first dies to a substrate via a hybrid bonding process; performing a selective silicon (Si) thinning process to reduce a thickness of the plurality of first dies that are bonded to form a plurality of thinned first dies; passivating the plurality of thinned first dies to form a plurality of passivated thinned first dies to protect the plurality of thinned first dies; filling gaps between adjacent dies of the plurality of thinned first dies with a first fill material, wherein the plurality of passivated thinned first dies and the first fill material together form a first layer; and forming a plurality of first conductive vias through the first layer to the substrate.

16 Claims, 6 Drawing Sheets

(56) References Cited

U.S. PATENT DOCUMENTS

| 2021/0183847 | A1* | 6/2021 | Uzoh | ..................... | H01L 21/306 |
| 2022/0271012 | A1 | 8/2022 | Chen et al. | | |
| 2022/0359326 | A1* | 11/2022 | Yu | ....................... | H01L 23/5226 |

* cited by examiner

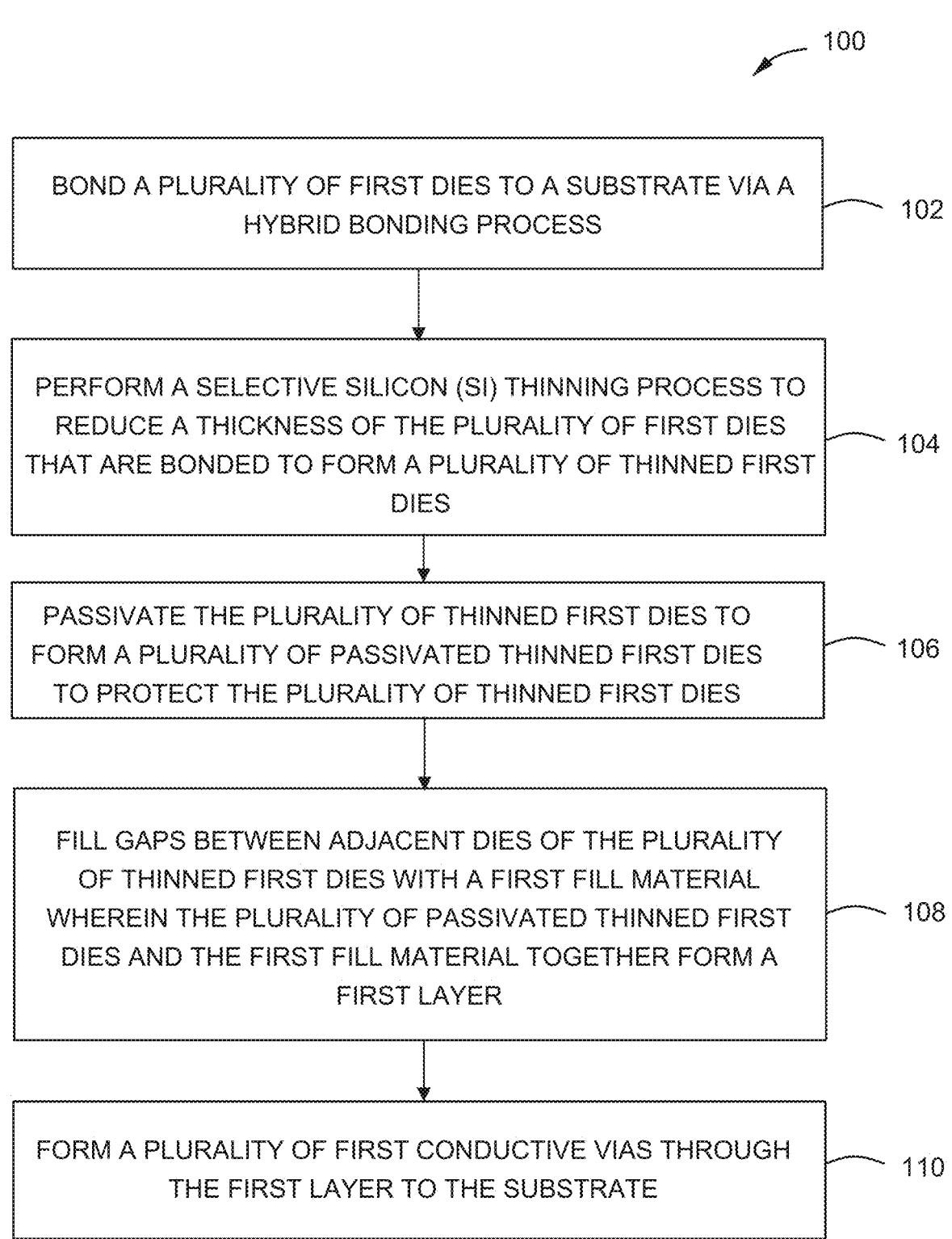

100

| BOND A PLURALITY OF FIRST DIES TO A SUBSTRATE VIA A HYBRID BONDING PROCESS | 102 |

PERFORM A SELECTIVE SILICON (SI) THINNING PROCESS TO REDUCE A THICKNESS OF THE PLURALITY OF FIRST DIES THAT ARE BONDED TO FORM A PLURALITY OF THINNED FIRST DIES — 104

PASSIVATE THE PLURALITY OF THINNED FIRST DIES TO FORM A PLURALITY OF PASSIVATED THINNED FIRST DIES TO PROTECT THE PLURALITY OF THINNED FIRST DIES — 106

FILL GAPS BETWEEN ADJACENT DIES OF THE PLURALITY OF THINNED FIRST DIES WITH A FIRST FILL MATERIAL WHEREIN THE PLURALITY OF PASSIVATED THINNED FIRST DIES AND THE FIRST FILL MATERIAL TOGETHER FORM A FIRST LAYER — 108

FORM A PLURALITY OF FIRST CONDUCTIVE VIAS THROUGH THE FIRST LAYER TO THE SUBSTRATE — 110

FIG. 1

METHOD OF MULTI-LAYER DIE STACKING WITH DIE-TO-WAFER BONDING

FIELD

Embodiments of the present disclosure generally relate to methods of processing a substrate.

BACKGROUND

Conventional multi-layer die stacking, for example, in memory applications, is done using a flip-chip approach. Such a process includes attaching a semiconductor die with a bond pad side down to a substrate or carrier. The electrical connection is made via a conductive bump on the die bond pad. Once the die is connected, the stand-off distance between the die and substrate is typically filled with a non-conductive adhesive referred to as underfill. The underfill provides stress relief between the die and carrier, provides robustness, and protects the component from any moisture ingress.

However, the vertical height of the conductive bump and the underfill process restricts the number of stacks of memory, or other devices, that can be formed while maintaining a maximum form factor (<770 micrometers). Accordingly, the inventors have provided herein embodiments of methods for improving device capacity.

SUMMARY

Embodiments of methods of die stacking are provided herein. In some embodiments, a method of die stacking with die-to-wafer bonding includes: bonding a plurality of first dies to a substrate via a hybrid bonding process; performing a selective silicon (Si) thinning process to reduce a thickness of the plurality of first dies that are bonded to form a plurality of thinned first dies; passivating the plurality of thinned first dies to form a plurality of passivated thinned first dies to protect the plurality of thinned first dies; filling gaps between adjacent dies of the plurality of thinned first dies with a first fill material, wherein the plurality of passivated thinned first dies and the first fill material together form a first layer; and forming a plurality of first conductive vias through the first layer to the substrate.

In some embodiments, a non-transitory computer readable medium contains instructions that, when executed by one or more processors, performs a method of die stacking with die-to-wafer bonding that includes: bonding a plurality of first dies to a substrate via a hybrid bonding process; performing a selective silicon (Si) thinning process to reduce a thickness of the plurality of first dies that are bonded to form a plurality of thinned first dies; passivating the plurality of thinned first dies to form a plurality of passivated thinned first dies to protect the plurality of thinned first dies; filling gaps between adjacent dies of the plurality of thinned first dies with a first fill material, wherein the plurality of passivated thinned first dies and the first fill material together form a first layer; and forming a plurality of first conductive vias through the first layer to the substrate.

In some embodiments, a method of die stacking with die-to-wafer bonding includes: forming a plurality of stacked layers on a substrate, wherein forming each stacked layer in the plurality of stacked layers, comprises: bonding a plurality of dies to an underlayer via a hybrid bonding process, wherein the underlayer is the substrate or one the plurality of stacked layers; performing a selective silicon (Si) thinning process to reduce a thickness of the plurality of dies that are bonded to form a plurality of thinned dies; passivating the plurality of thinned dies to protect the plurality of thinned dies; filling gaps between adjacent dies of the plurality of thinned dies with a fill material; and forming a plurality of conductive vias extending through the plurality of stacked layers via at least one of the fill material or the plurality of thinned dies.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 depicts a flow chart of a method of die stacking with die-to-wafer bonding in accordance with at least some embodiments of the present disclosure.

Figure 2A:
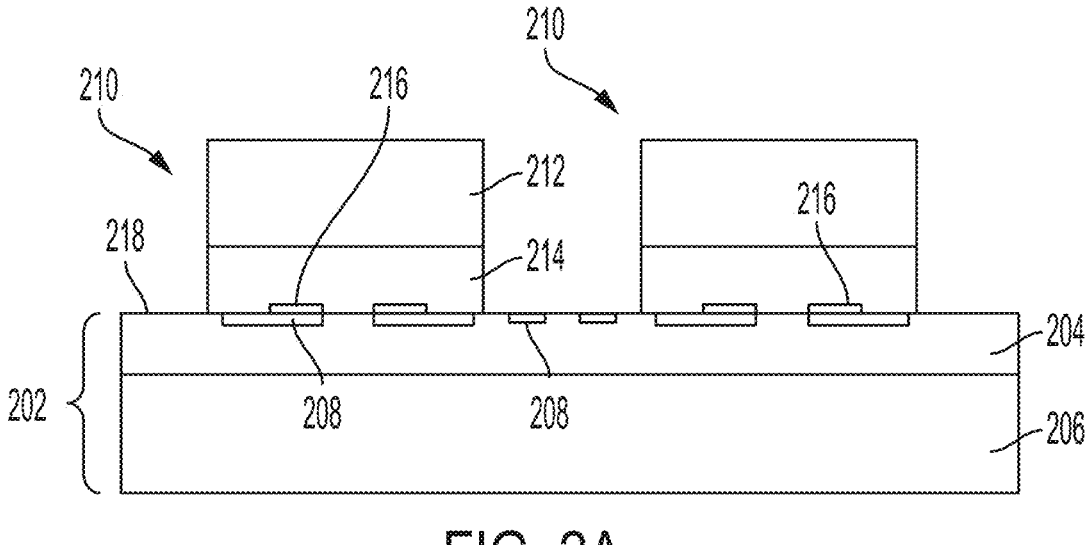
FIG. 2A depicts a schematic cross-sectional side view of a plurality of dies bonded to a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods of die stacking are provided herein. The methods provided herein use direct hybrid bonding, removing the use of a conductive bump and underfill layer during die stacking. Such methods advantageously reduce a vertical height of each die layer so that more dies can be stacked while maintaining a fixed maximum form factor of <770 micrometers, which corresponds with a typical silicon wafer thickness. The dies may include one or more integrated circuit (IC) devices. A non-limiting example of an IC device is a memory IC, or memory. Accordingly, a reduced vertical height of each die layer advantageously increases memory capacity of the stack. Without the use of an underfill layer, the die stack advantageously may have improved stress, improved form factor, and improved thermal dissipation of memory-stacks.

FIG. 1 depicts a flow chart of a method 100 of die stacking with die-to-wafer bonding in accordance with at least some embodiments of the present disclosure. At 102, the method 100 includes, as depicted in FIG. 2A, bonding a plurality of first dies (e.g., plurality of first dies 210) to a substrate (e.g., substrate 202) via a hybrid bonding process. The plurality of dies may be bonded to the substrate with device side down. Bonding the plurality of first dies to the substrate may be performed in a bonding chamber (e.g., bonder chamber 540). FIG. 2A depicts a schematic cross-sectional side view of a plurality of first dies 210 bonded to a substrate 202 in accordance with at least some embodiments of the present disclosure. The substrate 202 may comprise a dielectric layer 204 disposed on a silicon layer 206.

In some embodiments, the substrate 202 includes one or more bonding pads 208 that may be disposed in the dielectric layer 204, aligned with locations of the plurality of first dies 210 and formed at an upper side 218 of the substrate 202. In some embodiments, the one or more bonding pads 208 are made of a conductive material. In some embodiments, the substrate 202 includes one or more bonding pads 208 that may be disposed in the dielectric layer 204 at locations that do not align with the plurality of first dies 210 and formed at the upper side 218 of the substrate 202.

Figure 2B:
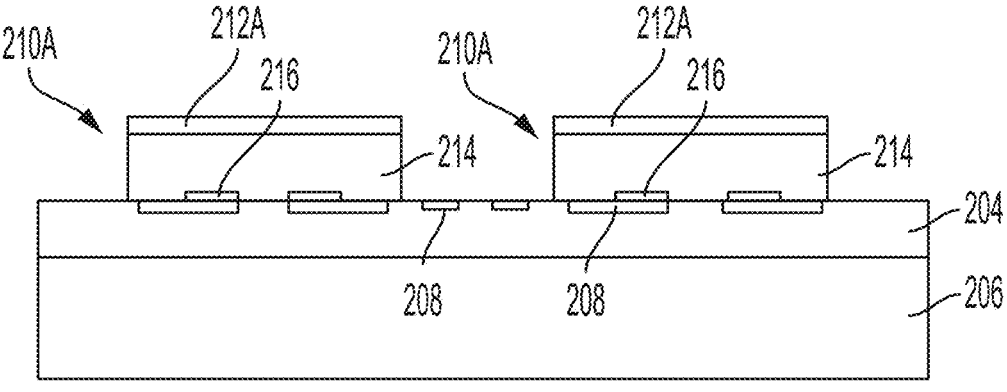
FIG. 2B depicts a schematic cross-sectional side view of a plurality of thinned dies after a selective silicon (Si) thinning process in accordance with at least some embodiments of the present disclosure.
Figure 2C:
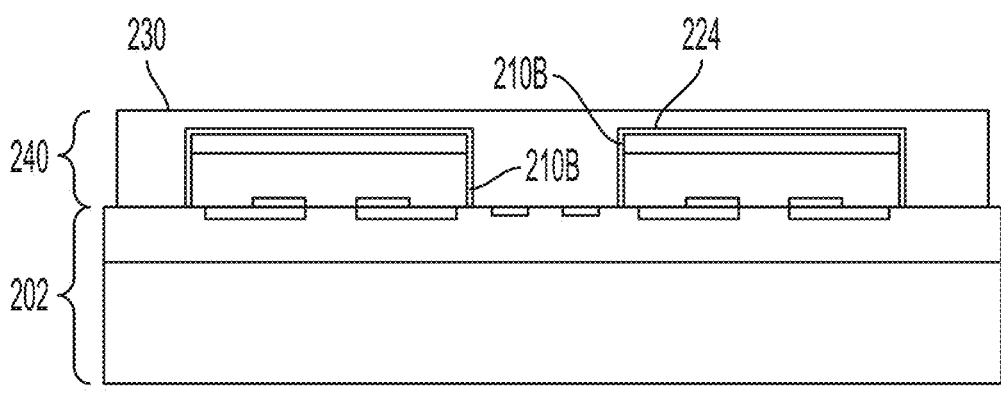
FIG. 2C depicts a schematic cross-sectional side view of a plurality of passivated thinned dies with gaps between adjacent dies filled with a fill material in accordance with at least some embodiments of the present disclosure.
Figure 2D:
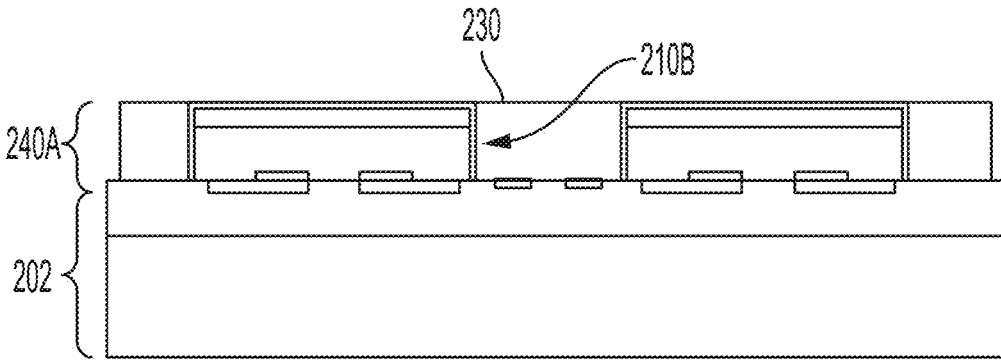
FIG. 2D depicts a schematic cross-sectional side view of a planarized first layer in accordance with at least some embodiments of the present disclosure.
Figure 2E:
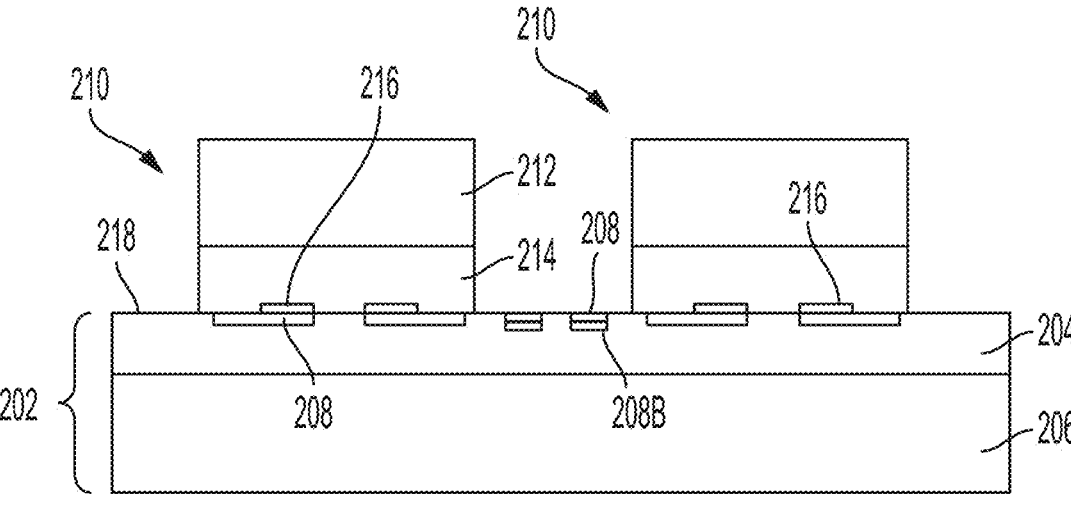
FIG. 2E depicts a schematic cross-sectional side view of a plurality of dies bonded to a substrate having bonding pads and landing pads in accordance with at least some embodiments of the present disclosure.

In some embodiments, the substrate 202 includes one or more landing pads 208B, as depicted in FIG. 2E, that may be disposed in the dielectric layer 204 at locations that do not align with the plurality of first dies 210, covered with a dielectric material, for example, the one or more bonding pads 208, and formed proximate the upper side 218 of the substrate 202. The one or more landing pads 208B may be made of a conductive material. The use of one or more landing pads 208B that are made of a conductive material covered with one or more bonding pads 208 formed of a dielectric material advantageously prevents exposed conductive material during subsequent processes (e.g., silicon thinning process) that may contaminate process chambers in which the subsequent processes are carried out.

A plurality of first dies 210 are bonded to the substrate 202 via a suitable hybrid bonding process. A hybrid bonding process is generally a process that connects dies using small copper-to-copper connections, as opposed to bumps. In some embodiments, the plurality of first dies 210 comprise a silicon layer 212 coupled to a dielectric layer 214. The silicon layer 212 generally contains transistors, such as for front-end-of-line (FEOL) logic or memory function. The dielectric layer 214 includes back-end interconnects to at least one or more bonding pads 216, with connectivity down to transistors disposed in other dies of the stacked dies. In some embodiments, the one or more bonding pads 216 comprise connectivity to active transistors that form memory cells. In some embodiments, the one or more bonding pads 216 are aligned with corresponding ones of the one or more bonding pads 208 of the substrate 202. In some embodiments, prior to bonding with the substrate 202, a thickness of the silicon layer 212 of the plurality of first dies 210 is greater than a thickness of the dielectric layer 214. Such a thickness of the silicon layer 212 advantageously provides a stronger and more reliable bond. In some embodiments, the plurality of first dies 210 have a thickness of about 40 to about 150 micrometers.

At 104, the method 100 includes performing a selective silicon (Si) thinning process to reduce a thickness of the plurality of first dies that are bonded to form a plurality of thinned first dies (e.g., a plurality of thinned first dies 210A). The selective Si thinning process comprises reducing the thickness of the silicon layer 212. In some embodiments, reducing the thickness of the plurality of first dies comprises thinning the plurality of first dies to a thickness of about 2 to about 12 microns. The thinning process may be performed in an etch chamber or any other suitable tool, for example, a combination of a grinding and chemical-mechanical polishing tool.

FIG. 2B depicts a schematic cross-sectional side view of a plurality of thinned first dies 210A after a selective silicon (Si) thinning process in accordance with at least some embodiments of the present disclosure. In some embodiments, a thinned silicon layer 212A has a thickness less than the thickness of the dielectric layer 214.

At 106, the method 100 includes passivating the plurality of thinned first dies to form a plurality of passivated thinned first dies (e.g., passivated plurality of first dies 210B), as depicted in FIG. 2C, to protect the plurality of thinned first dies. In some embodiments, the plurality of thinned first dies are passivated with a nitride layer (e.g., nitride layer 224), such as a layer of silicon nitride (SiN) or silicon carbonitride (SiCN). The passivating process may be performed in a suitable deposition chamber, such as a chemical vapor deposition chamber (CVD). At 108, the method 100 includes filling gaps between adjacent dies of the plurality of thinned first dies with a first fill material (e.g., first fill material 230), as depicted in FIG. 2C. The first fill material may be deposited in a suitable deposition chamber, such as a CVD chamber. In some embodiments, the passivation process and the first fill material deposition process are performed in the same chamber. The plurality of passivated thinned first dies and the first fill material together form a first layer (e.g., first layer 240).

FIG. 2C depicts a schematic cross-sectional side view of a passivated plurality of first dies 210B with gaps between adjacent dies filled with a first fill material 230 in accordance with at least some embodiments of the present disclosure. The first fill material 230 may generally comprise a dielectric material. In some embodiments, the first fill material 230 comprises an organic dielectric material such as an epoxy mold compound or polymer. In some embodiments, the first fill material 230 comprises an inorganic material such a combination of silicon nitride ($Si_3N_4$) and silicon dioxide ($SiO_2$). In some embodiments, the first fill material 230 comprises essentially of silicon oxide. In some embodiments, the first fill material 230 comprises essentially of epoxy mold compound or polymer. In some embodiments, the first fill material 230 covers the passivated plurality of first dies 210B such that there is a thin layer of the first fill material 230 vertically above the passivated plurality of first dies 210B.

In some embodiments, the method 100 includes planarizing the first layer via a suitable planarization process. In some embodiments, the planarization process is a chemical-mechanical planarization (CMP) process. FIG. 2D depicts a schematic cross-sectional side view of a planarized first layer 240A in accordance with at least some embodiments of the present disclosure. In some embodiments, as depicted in FIG. 2D, the first fill material 230 is planarized so that a little of the first fill material 230 covers the passivated plurality of first dies 210B. In some embodiment, the first fill material 230 is planarized so that an upper surface of the first fill material 230 is flush with an upper surface of the passivated plurality of first dies 210B. In some embodiment, the first fill material 230 and the passivated plurality of first dies 210B are planarized and an upper surface of the first fill material 230 is flush with an upper surface of the passivated plurality of first dies 210B post-planarization.

Figure 3A:
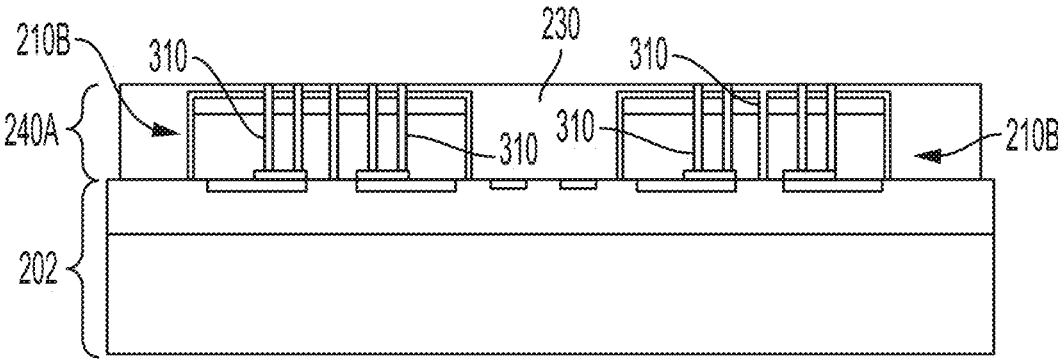
FIG. 3A depicts a schematic cross-sectional side view of a plurality of conductive vias formed through a plurality of passivated thinned dies via a through-silicon-via (TSV) process in accordance with at least some embodiments of the present disclosure.
Figure 4A:
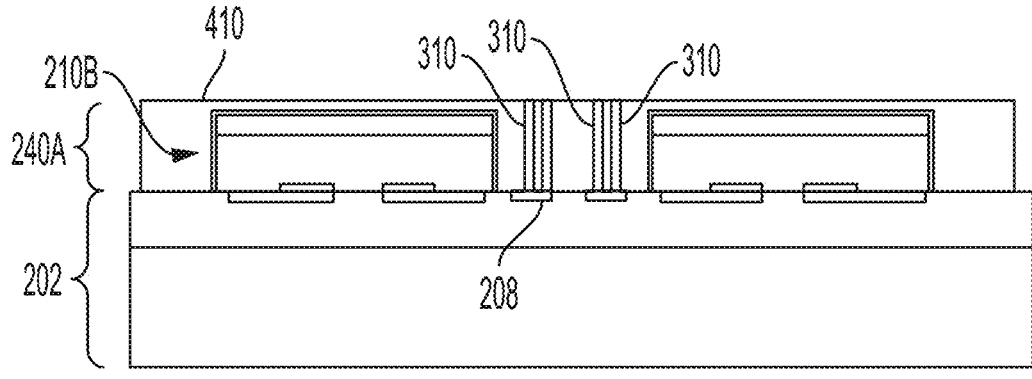
FIG. 4A depicts a schematic cross-sectional side view of a plurality of conductive vias formed through a plurality of passivated thinned dies via a through-dielectric-via (TDV) process in accordance with at least some embodiments of the present disclosure.

At 110, the method 100 includes forming a plurality of first conductive vias (e.g., plurality of first conductive vias 310) through the first layer to the substrate. In some embodiments, forming the plurality of first conductive vias is performed as a through-silicon-via (TSV) process, as depicted in FIG. 3A, where the first conductive vias extend through the plurality of first dies. In some embodiments, forming the plurality of first conductive vias is performed as a through-dielectric-via (TDV) process, as depicted in FIG. 4A, where the first conductive vias extend through the first fill material and not through the plurality of first dies (i.e., outside of the plurality of first dies). In some embodiments, the plurality of first vias may be formed in an etch chamber. In some embodiments, the plurality of first vias, for example when formed via the TSV process, may be formed in a chemical vapor deposition (CVD) chamber to form a liner oxide. The plurality of first conductive vias may be formed in a physical vapor deposition (PVD) chamber to deposit a barrier metal and copper seed into the plurality of first vias before copper plating to fill the plurality of vias.

In some embodiments, the method 100 includes forming bond pads (e.g., bond pads 420) that are electrically coupled to the plurality of conductive vias. In some embodiments, the bond pads 420 are formed by etching an upper surface 410 of the first layer 240, 240A and depositing a conductive material. The formation of the bond pads 420 facilitates electrical connection between the first layer 240, 240A and the one or more bonding pads 208 or one or more landing pads 208B of the substrate 202.

Figure 4B:
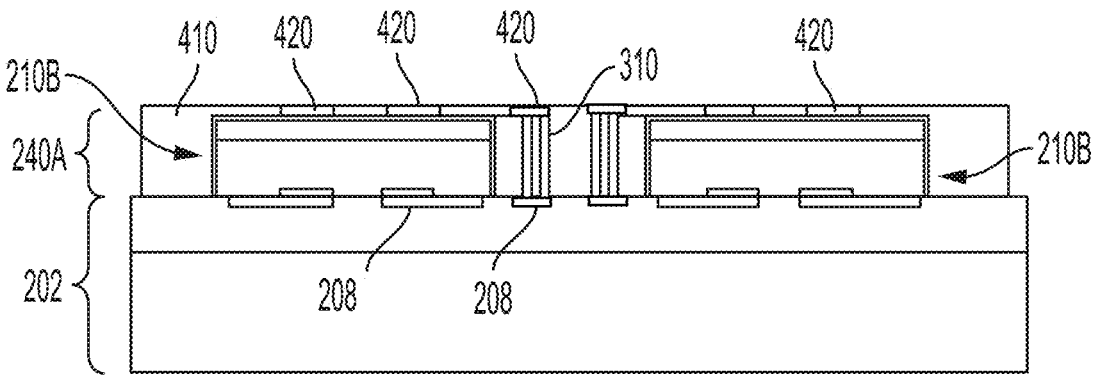
FIG. 4B depicts a schematic cross-sectional side view of a plurality of bond pads that are electrically coupled to a plurality of conductive vias in accordance with at least some embodiments of the present disclosure.

FIG. 3A depicts a schematic cross-sectional side view of a plurality of conductive vias 310 formed through a passivated plurality of first dies 210B via a through-silicon-via (TSV) process in accordance with at least some embodiments of the present disclosure. FIG. 4A depicts a schematic cross-sectional side view of a plurality of conductive vias 310 formed through a plurality of passivated thinned dies via a through-dielectric-via (TDV) process in accordance with at least some embodiments of the present disclosure. FIG. 4B depicts a schematic cross-sectional side view of a plurality of bond pads (e.g., bond pads 420) that are electrically coupled to a plurality of conductive vias in accordance with at least some embodiments of the present disclosure. The plurality of conductive vias 310 may comprise one or more vias extending from each of the plurality of bond pads 420.

The formation of the conductive vias 310 with a TSV process advantageously requires minimal design change, for example, with existing TSV creation process flow. However, the formation of the conductive vias 310 via a TDV process improves the yield of the stacked dies. For example, with the plurality of conductive vias 310 extending outside of the plurality of dies, there is more space in the plurality of first dies for additional devices, such as additional memory cells.

The method 100 may be repeated one or more times to form a plurality of stacked layers (e.g., plurality of stacked layers 330) on a substrate 202. For example, the method 100 may include bonding a plurality of second dies to the first layer 240A via a hybrid bonding process. The method 100 may include performing a selective silicon (Si) thinning process to reduce a thickness of the plurality of second dies that are bonded to form a plurality of thinned second dies.

Figure 3B:
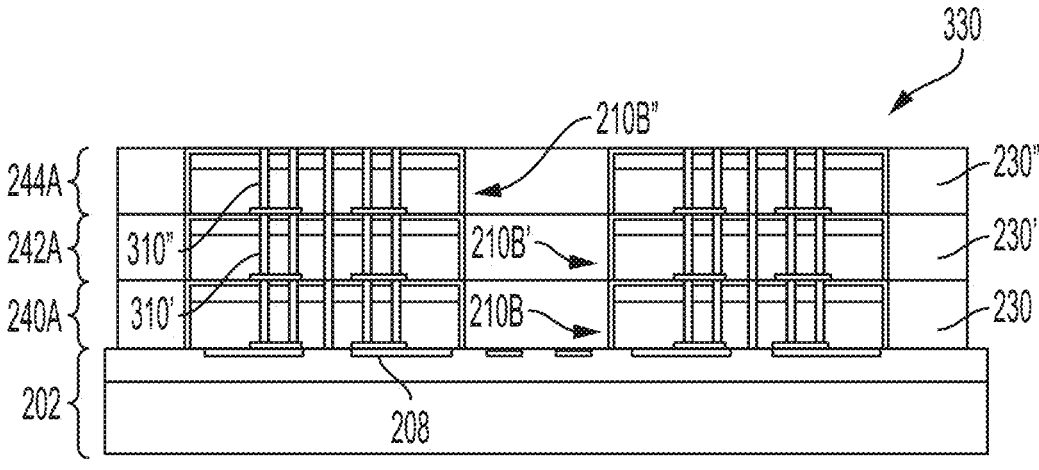
FIG. 3B depicts a schematic cross-sectional side view of a plurality of stacked layers on a substrate, where each of the stacked layers include a plurality of conductive vias formed through a plurality of passivated thinned dies via a through-silicon-via (TSV) process in accordance with at least some embodiments of the present disclosure.
Figure 4C:
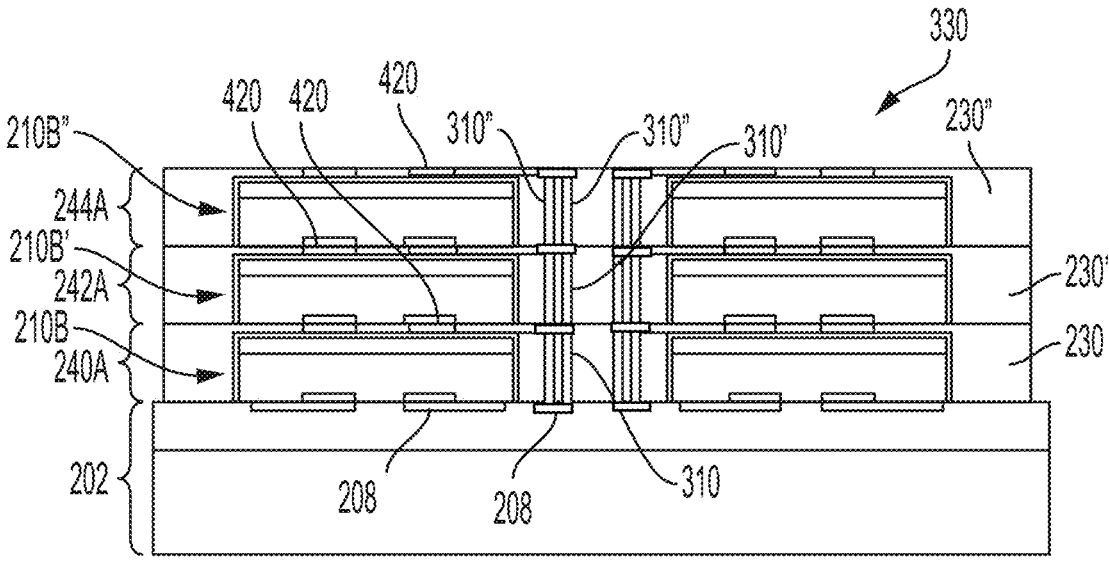
FIG. 4C depicts a schematic cross-sectional side view of a plurality of stacked layers on a substrate, where each of the stacked layers include a plurality of conductive vias formed through a fill material via a through-dielectric-via (TDV) process in accordance with at least some embodiments of the present disclosure.

The method 100 may further includes passivating the plurality of thinned second dies to form a plurality of passivated thinned second dies (e.g., passivated thinned second dies 210B') to protect the plurality of thinned second dies. In some embodiments, the method 100 includes filling gaps between adjacent dies of the plurality of thinned second dies with a second fill material (e.g., second fill material 230') comprising a material similar to the first fill material. The plurality of passivated thinned second dies and the second fill material together form a second layer (e.g., second layer 242A). In some embodiments, the method 100 includes forming a plurality of second conductive vias (e.g., plurality of second conductive vias 310') through the second layer. The plurality of second conductive vias are generally aligned with the plurality of first conductive vias. In some embodiments, the plurality of second conductive vias may be formed through the plurality of passivated thinned second dies as depicted in FIG. 3B. In some embodiments, the plurality of second conductive vias may be formed through a second fill material 230', as depicted in FIG. 4C.

FIG. 3B further depict a third layer 244A disposed on the second layer 242A, with a plurality of third conductive vias 310" extending through a plurality of passivated thinned third dies 210B". FIG. 4C further depicts a third layer 244A disposed on the second layer 242A with a plurality of third conductive vias 310" extending through a third fill material 230". Accordingly, a plurality of layers having a plurality of dies may be stacked atop each other to form a plurality of stacked layers to a maximum form factor. For example, each stacked layer in the plurality of stacked layers, comprises bonding a plurality of dies to an underlayer via a hybrid bonding process, where the underlayer is the substrate 202 or one the plurality of stacked layers (e.g., first layer 240A, second layer 242A, third layer 244A, etc.).

Figure 5:
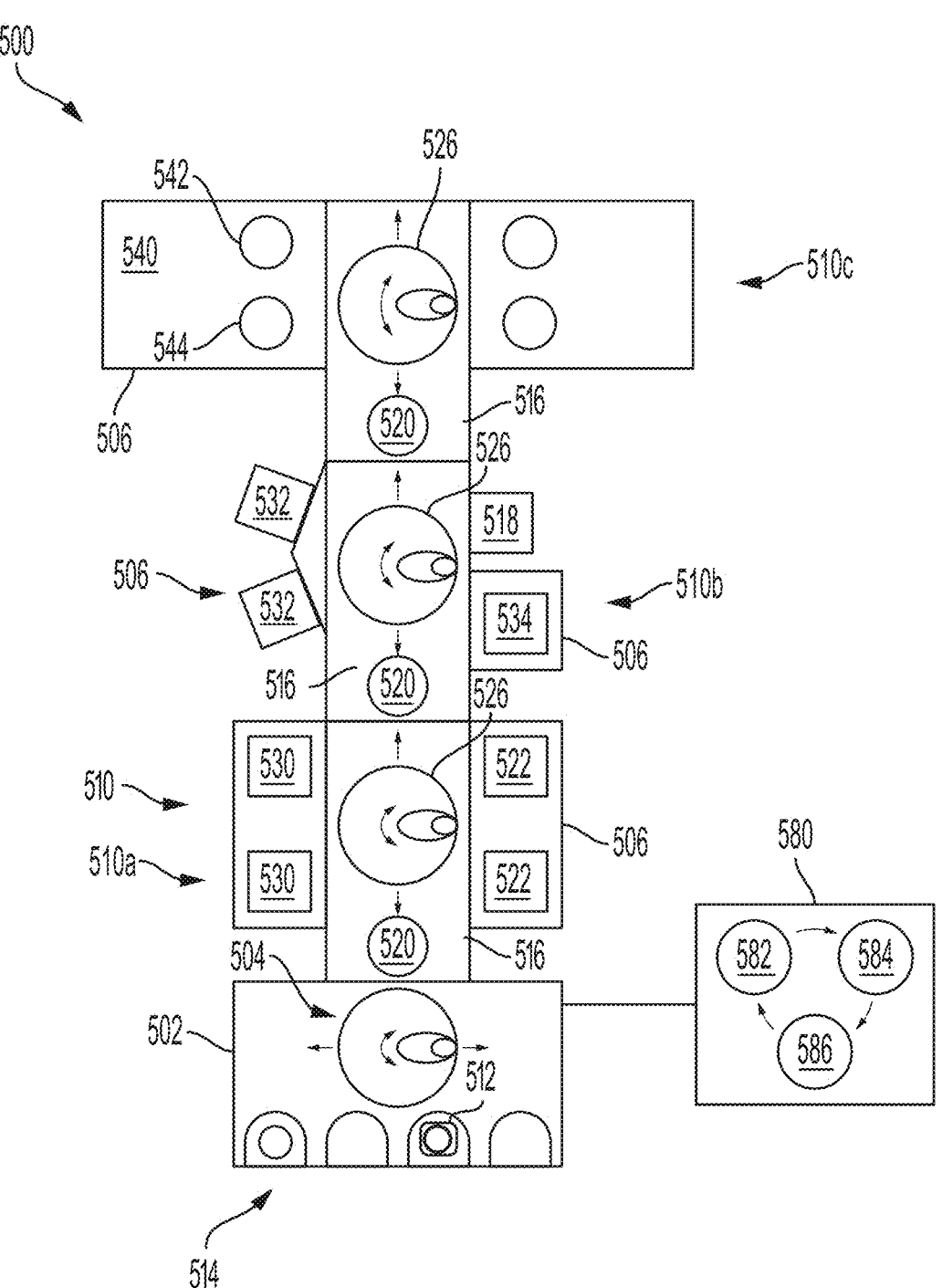
FIG. 5 depicts a schematic isometric view of a multi-chamber processing tool configured for at least partially performing a method of die stacking with die-to-wafer bonding in accordance with at least some embodiments of the present disclosure.

FIG. 5 depicts a schematic top view of a multi-chamber processing tool configured for at least partially performing a method of die stacking with die-to-wafer bonding in accordance with at least some embodiments of the present disclosure. The multi-chamber processing tool 500 generally includes an equipment front end module (EFEM) 502 and a plurality of AMMs 510 that are serially coupled to the EFEM 502. The plurality of AMMs 510 are configured to shuttle one or more types of substrates 512 from the EFEM 502 through the multi-chamber processing tool 500 and perform one or more processing steps to the one or more types of substrates 512. Each of the plurality of AMMs 510 generally include a transfer chamber 516 and one or more process chambers 506 coupled to the transfer chamber 516 to perform the one or more processing steps. The plurality of AMMs 510 are coupled to each other via their respective transfer chamber 516 to advantageously provide modular expandability and customization of the multi-chamber processing tool 500. As depicted in FIG. 1, the plurality of AMMs 510 comprise three AMMs, where a first AMM 510a is coupled to the EFEM 502, a second AMM 510b is coupled to the first AMM 510a, and a third AMM 510c is coupled to the second AMM 510b.

The EFEM 502 includes a plurality of loadports 514 for receiving one or more types of substrates 512. In some embodiments, the one or more types of substrates 512 include 200 mm wafers, 300 mm wafers, 450 mm wafers, tape frame substrates, carrier substrates, silicon substrates, glass substrates, or the like. An EFEM robot 504 is disposed in the EFEM 502 and configured to transport substrates 512 between the plurality of loadports 514.

The one or more process chambers 506 may be sealingly engaged with the transfer chamber 516. The transfer chamber 516 generally operates at atmospheric pressure but may be configured to operate at vacuum pressure. The transfer chamber 516 includes a buffer 520 configured to hold the one or more types of substrates 512. In some embodiments, the buffer 520 is disposed within the interior volume of the transfer chamber 516, advantageously reducing the footprint of the overall tool. The transfer chamber may include a transfer robot 526 disposed therein configured to transport substrates 512 between the one or more process chamber 506 and the buffer 520.

The one or more process chambers 506 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chamber, or the like. Examples of vacuum chambers may include plasma chambers. The types of atmospheric chambers discussed above may also be configured to operate under vacuum, if needed. The one or more process chambers 506 may be any process chambers or modules needed to perform a bonding process, a dicing process, a cleaning process, a plating process, or the like.

In some embodiments, the one or more process chambers 506 of each of the plurality of AMMs 510 include at least one of a wet clean chamber 522, a plasma chamber 530, a degas chamber 532, a radiation chamber 534, or a bonder chamber 540 such that the multi-chamber processing tool 500 includes at least one wet clean chamber 522, at least one plasma chamber 530, at least one degas chamber 532, at least one radiation chamber 534, and at least one bonder chamber 540.

The bonder chamber 540 is configured to transfer and bond, for example, the plurality of first dies 210 to the substrate 202. The bonder chamber 140 may generally include a first support 542 to support one of the substrates 202 and a second support 544 to support a second substrate, for example, a substrate having the plurality of dies 210 to be bonded to the substrate 202.

A controller 580 controls the multi-chamber processing tool 500 described herein. The controller 580 may use a direct control of the multi-chamber processing tool 500, or alternatively, by controlling the computers (or controllers) associated with the multi-chamber processing tool 500. In operation, the controller 580 enables data collection and feedback from the multi-chamber processing tool 500 to optimize performance of the multi-chamber processing tool 500. The controller 580 generally includes a Central Processing Unit (CPU) 582, a memory 584, and a support circuit 586. The CPU 582 may be any form of a general-purpose computer processor that can be used in an industrial setting. The support circuit 586 is conventionally coupled to the CPU 582 and may comprise a cache, clock circuits, input/output subsystems, power supplies, and the like. Software routines, such as a method as described below may be stored in the memory 584 and, when executed by the CPU 582, transform the CPU 582 into a specific purpose computer (controller 580). The software routines may also be stored and/or executed by a second controller (not shown) that is located remotely from the multi-chamber processing tool 500.

The memory 584 is in the form of computer-readable storage media that contains instructions, when executed by the CPU 582, to facilitate the operation of the semiconductor processes and equipment. The instructions in the memory 584 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

While the foregoing is directed to embodiments of the present disclosure, other and further embodiments of the disclosure may be devised without departing from the basic scope thereof.

The invention claimed is:

1. A method of die stacking with die-to-wafer bonding, comprising:

bonding a plurality of first dies to a substrate via a hybrid bonding process;

performing a selective silicon (Si) thinning process to reduce a thickness of the plurality of first dies that are bonded to form a plurality of thinned first dies;

passivating the plurality of thinned first dies to form a plurality of passivated thinned first dies to protect the plurality of thinned first dies;

filling gaps between adjacent dies of the plurality of thinned first dies with a first fill material, wherein the plurality of passivated thinned first dies and the first fill material together form a first layer;

forming a plurality of first conductive vias through the first layer to the substrate; and further comprising at least one of:

(a) planarizing the plurality of thinned first dies and first fill material prior to forming the plurality of first conductive vias;

or (b) bonding a plurality of second dies to the first layer via a hybrid bonding process;

performing a selective silicon (Si) thinning process to reduce a thickness of the plurality of second dies that are bonded to form a plurality of thinned second dies;

passivating the plurality of thinned second dies to form a plurality of passivated thinned second dies to protect the plurality of thinned second dies;

filling gaps between adjacent dies of the plurality of thinned second dies with a second fill material, wherein the plurality of passivated thinned second dies and the second fill material together form a second layer; and forming a plurality of second conductive vias through the second layer, wherein the plurality of second conductive vias are aligned with the plurality of first conductive vias.

2. The method of claim 1, wherein forming the plurality of first conductive vias is performed as a through-silicon-via (TSV) process where the first conductive vias extend through the plurality of first dies.

3. The method of claim 1, wherein forming the plurality of first conductive vias is performed as a through-dielectric-via (TDV) process where the first conductive vias extend through the first fill material and not through the plurality of first dies.

4. The method of claim 1, wherein reducing the thickness of the plurality of first dies comprises thinning the plurality of first dies to a thickness of 2 to about 12 microns.

5. The method of claim 1, wherein the first fill material comprises essentially of silicon oxide, silicon dioxide, epoxy mold compound, or polymer.

6. The method of claim 1, wherein the plurality of thinned first dies are passivated with a layer of silicon nitride (SiN) or silicon carbonitride (SiCN).

7. The method of claim 1, wherein passivating the plurality of thinned first dies is performed in a chemical vapor deposition (CVD) chamber, and wherein bonding the plurality of first dies is performed in a bonding chamber.

8. A non-transitory computer readable medium that contains instructions that, when executed by one or more processors, perform a method of die stacking with die-to-wafer bonding, comprising:

bonding a plurality of first dies to a substrate via a hybrid bonding process;

performing a selective silicon (Si) thinning process to reduce a thickness of the plurality of first dies that are bonded to form a plurality of thinned first dies;

passivating the plurality of thinned first dies to form a plurality of passivated thinned first dies to protect the plurality of thinned first dies;

filling gaps between adjacent dies of the plurality of thinned first dies with a first fill material, wherein the plurality of passivated thinned first dies and the first fill material together form a first layer;

forming a plurality of first conductive vias through the first layer to the substrate; and further comprising at least one of:

(a) planarizing the plurality of thinned first dies and first fill material prior to forming the plurality of first conductive vias;

or (b) bonding a plurality of second dies to the first layer via a hybrid bonding process;

performing a selective silicon (Si) thinning process to reduce a thickness of the plurality of second dies that are bonded to form a plurality of thinned second dies;

passivating the plurality of thinned second dies to form a plurality of passivated thinned second dies to protect the plurality of thinned second dies;

filling gaps between adjacent dies of the plurality of thinned second dies with a second fill material comprising an organic dielectric material, wherein the plurality of passivated thinned second dies and the second fill material together form a second layer; and forming a plurality of second conductive vias through the second layer, wherein the plurality of second conductive vias are aligned with the plurality of first conductive vias.

9. The non-transitory computer readable medium of claim 8, wherein forming the plurality of first conductive vias is performed as a through-silicon-via (TSV) process where the first conductive vias extend through the plurality of first dies.

10. The non-transitory computer readable medium of claim 8, wherein forming the plurality of first conductive vias is performed as a through-dielectric-via (TDV) process where the first conductive vias extend through the first fill material.

11. A method of die stacking with die-to-wafer bonding, comprising:

forming a plurality of stacked layers on a substrate, wherein forming each stacked layer in the plurality of stacked layers, comprises:

bonding a plurality of dies to an underlayer via a hybrid bonding process, wherein the underlayer is the substrate or one of the plurality of stacked layers;

performing a selective silicon (Si) thinning process to reduce a thickness of the plurality of dies that are bonded to form a plurality of thinned dies;

passivating the plurality of thinned dies to protect the plurality of thinned dies;

filling gaps between adjacent dies of the plurality of thinned dies with a fill material, wherein the passivated plurality of thinned dies and the fill material together form a first layer;

forming a plurality of first conductive vias extending through the plurality of stacked layers via at least one of the fill material or the plurality of thinned dies; and further comprising at least one of:

(a) planarizing the plurality of thinned dies and the fill material prior to forming the plurality of first conductive vias;

or (b) bonding a plurality of second dies to the first layer via a hybrid bonding process;

performing a selective silicon (Si) thinning process to reduce a thickness of the plurality of second dies that are bonded to form a plurality of thinned second dies;

passivating the plurality of thinned second dies to form a plurality of passivated thinned second dies to protect the plurality of thinned second dies;

filling gaps between adjacent dies of the plurality of thinned second dies with a second fill material comprising an organic dielectric material, wherein the plurality of passivated thinned second dies and the second fill material together form a second layer; and forming a plurality of second conductive vias through the second layer, wherein the plurality of second conductive vias are aligned with the plurality of first conductive vias.

12. The method of claim 11, wherein forming the plurality of first conductive vias is performed as a through-silicon-via (TSV) process where the first conductive vias extend through the plurality of thinned dies.

13. The method of claim 11, wherein forming the plurality of first conductive vias is performed as a through-dielectric-via (TDV) process where the first conductive vias extend through the fill material and not through the plurality of thinned dies.

14. The method of claim 13, further comprising forming bond pads that are electrically coupled to the plurality of first conductive vias.

15. The method of claim 11, wherein the plurality of dies have memory cells.

16. The method of claim 11, wherein the plurality of dies have a thickness of 40 to 150 micrometers, and the plurality of thinned dies have a thickness of 2 to 12 micrometers.

\* \* \* \* \*